(12) United States Patent
Chen et al.

(10) Patent No.: US 8,823,440 B2
(45) Date of Patent: Sep. 2, 2014

(54) LEVEL SHIFTING CIRCUIT WITH DYNAMIC CONTROL

(71) Applicant: Novatek Microelectronics Corp., Hsinchu (TW)

(72) Inventors: Cheng-Hung Chen, Hsinchu County (TW); Ju-Lin Huang, Hsinchu County (TW); Keko-Chun Liang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/792,245

(22) Filed: Mar. 11, 2013

(65) Prior Publication Data

US 2014/0015587 A1    Jan. 16, 2014

(30) Foreign Application Priority Data

Jul. 16, 2012    (TW) .............................. 101125545 A

(51) Int. Cl.
     *H03L 5/00*      (2006.01)
(52) U.S. Cl.
     USPC ................................ 327/333; 326/80; 326/81

(58) Field of Classification Search
     USPC ........................................ 327/333; 326/80–81
     See application file for complete search history.

(56) References Cited

U.S. PATENT DOCUMENTS

| | | | | |
|---|---|---|---|---|
| 5,764,097 A | * | 6/1998 | Whitfield | 327/540 |
| 6,777,981 B2 | * | 8/2004 | Kobayashi | 326/81 |
| 2006/0033530 A1 | * | 2/2006 | Seo | 326/81 |

* cited by examiner

*Primary Examiner* — Kenneth B. Wells
(74) *Attorney, Agent, or Firm* — Jianq Chyun IP Office

(57) ABSTRACT

A level shifting circuit with dynamic control includes a dynamic controller and a level shifter. The dynamic controller outputs a dynamic voltage and an output data signal. The level shifter under control by the dynamic controller includes an input signal receiver, an output signal generator, and a bias current controller, which are coupled in series between a ground voltage and a high level voltage. The input signal receiver receives the output data signal of the dynamic controller and the output signal generator produces a level-shifted data signal according to the input data signal. The bias current controller controlled by the dynamic voltage is at a first current-output capability when the level-shifted data signal is at a stable stage and at a second current-output capability when the level-shifted data signal is at an unstable stage. The first current-output capability is greater than the second current-output capability.

14 Claims, 8 Drawing Sheets

LEVEL SHIFTING CIRCUIT WITH DYNAMIC CONTROL

CROSS-REFERENCE TO RELATED APPLICATION

This application claims the priority benefit of Taiwan application serial no. 101125545, filed on Jul. 16, 2012. The entirety of the above-mentioned patent application is hereby incorporated by reference herein and made a part of this specification.

BACKGROUND OF THE INVENTION

1. Field of Invention

The present invention relates to level shifting circuit. More particularly, the present invention relates to level shifting circuit with dynamic control.

2. Description of Related Art

Level shifting circuit is generally used to amplify the signal with small voltage range to a signal with larger voltage range. For example, a data signal with voltage range of 0V to 1V is shifted to a data signal with voltage range of 0V to 10V.

FIG. 1 is a drawing, schematically illustrating a conventional level shifting circuit. In FIG. 1, the conventional level shifting circuit 100 is composed of two N-type MOS (NMOS) field effect transistors M1 and M2 of and two P-type MOS (PMOS) field effect transistors M3 and M4. Two gates of the transistor M1 and the transistor M2 are respectively receiving a pair of input data IN and IN', which are complementary to each other. Each of the transistors M1 and M2 has two diffusion electrodes, serving as drain electrode or source electrode. The two source electrodes are connected to the ground voltage (GND) and another two drain electrodes output a pair of shifted data signals OUT and OUT', which are complementary to each other, and are also further connected to two transistor M3 and M4, respectively. The complementary signals have the voltage levels, opposite to each other. The transistor M3 and M4 form a cross-coupled structure. Two diffusion electrodes of the transistors M3 and M4 are connected to a high level voltage VDDH. Here, the high level voltage VDDL of the input data signals IN and IN' would be shifted to VDDH. In other words, the input data signals with the voltage range between VDDL and GND is shifted and output as the output data signals with the voltage range between VDDH and GND. VDDL is smaller than VDDH.

An initial state for the conventional level shifting circuit 100 as an example is IN=GND, IN'=VDDL, OUT=GND, and OUT'=VDDH. When the input data signal IN is changed to VDDL and the input data signal IN' is changed to GND, the transistor M1 is conducted and the transistor M2 is OFF. The output voltage maintains at the GND voltage, so the P-type transistor M3 is also conducted. This would cause a large short-circuit current, flowing to the ground GND through the transistors M3 and M1.

The foregoing conventional level shifting circuit 100 would increase the power consumption in the system due to the short circuit current.

SUMMARY OF THE INVENTION

Embodiments of the invention provide a level shifting circuit with dynamic control, capable of reducing the power consumption by reducing the short circuit current.

An embodiment of the invention provided a level shifting circuit with dynamic control, including a dynamic controller and a level shifter. The dynamic controller outputs a dynamic voltage and an output data signal. The level shifter under control by the dynamic controller includes an input signal receiver, an output signal generator, and a bias current controller, which are coupled in series between a ground voltage and a high level voltage. The input signal receiver receives the output data signal of the dynamic controller and the output signal generator produces a level-shifted data signal according to the input data signal. The bias current controller controlled by the dynamic voltage is at a first current-output capability when the level-shifted data signal is at a stable state and at a second current-output capability when the level-shifted data signal is at an unstable state. The first current-output capability is greater than the second current-output capability.

In an embodiment, the level shifting circuit with dynamic control can further include a bias generator to output a bias voltage. The dynamic controller can includes a dynamic bias generator and a trigger unit. The dynamic bias generator receives the bias voltage and a first voltage control signal and outputs the dynamic voltage. The dynamic voltage is a voltage state being output according to the first voltage control signal, to control the bias current controller of the level shifter. The trigger unit receives an input data signals and a second voltage control, and outputs the output data signals corresponding to the input data signals. The first voltage control signal and the second voltage control signal have an overlapping region within a period when the level-shifted data signal is at the unstable state.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Several embodiments are provided for describing level shifting circuit with dynamic control, which can reduce power consumption for the system. However, the invention is not limited to the provided embodiments.

Figure 1:
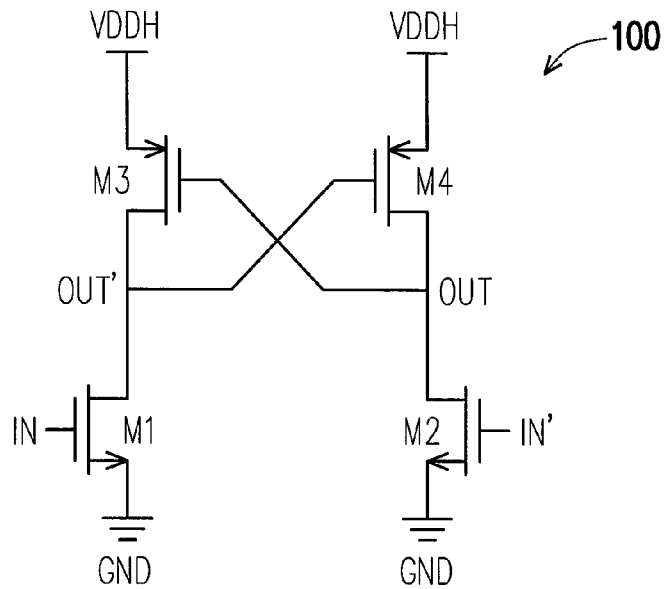
FIG. 1 is a circuit drawing, schematically illustrating a conventional level shifting circuit.
Figure 2:
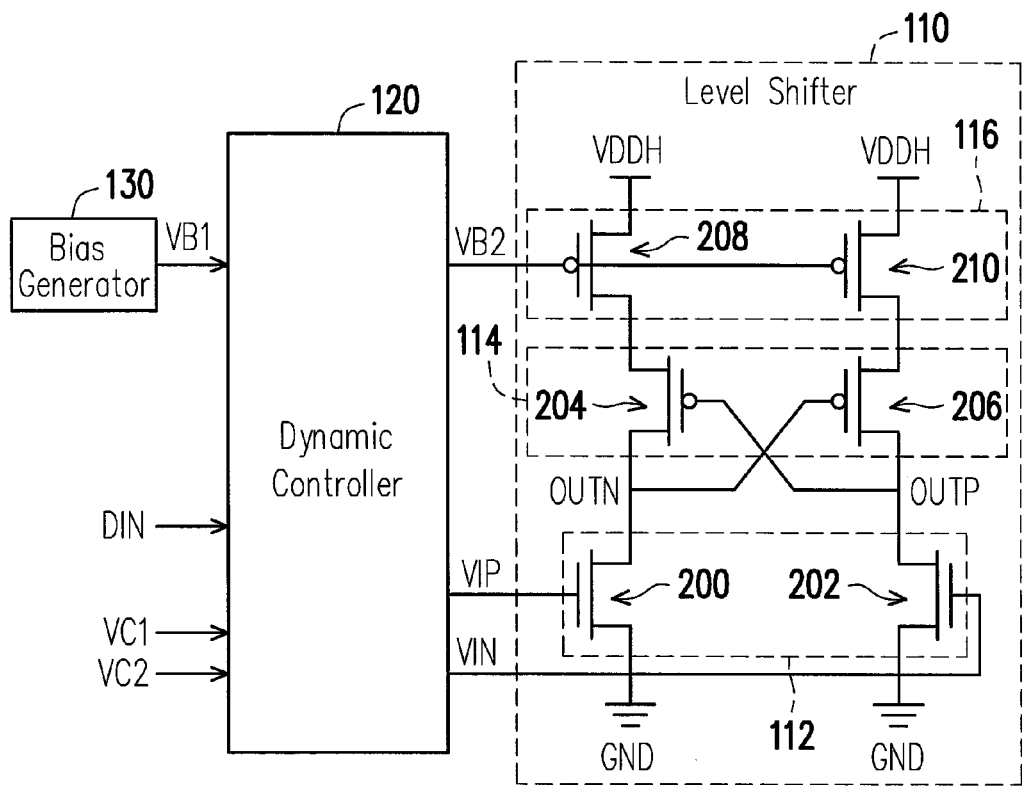
FIG. 2 is a circuit drawing, schematically illustrating a level shifting circuit with dynamic control, according to an embodiment of the invention.

FIG. 2 is a circuit drawing, schematically illustrating a level shifting circuit with dynamic control, according to an embodiment of the invention. In FIG. 2, the embodiment of the level shifting circuit with dynamic control can transfer a small voltage range, such as a rage of VDDL-GND for the input signal DIN, into a larger voltage range, such as a rage of VDDH-GND for the output signals OUTP and OUTN.

To the embodiment of level shifting circuit with dynamic control, it can include a dynamic controller 120 and a level shifter 110. The dynamic controller 120 outputs a dynamic voltage VB2 and the output data signals VIP/VIN. The level shifter 110, controlled by the dynamic controller 120, includes an input signal receiver 112, an output signal generator 114, and a bias current controller 116, which are coupled in series between a ground voltage GND and a high voltage level VDDH. The input signal receiver 112 receives the output data signals VIP/VIN from the dynamic controller 120. The output signal generator 114 generates level-shifted data voltage signals OUTP and OUTN according to the output data signals VIP/VIN. The bias current controller 116 is controlled by the dynamic voltage VB2. When the level-shifted data voltage signals OUTP and OUTN are at the stable stage, they have a first current output level. When the level-shifted data voltage signals OUTP and OUTN are at the unstable stage, they have a second current output level. The first current output level is greater than the second current output level.

The operation mechanism in better detail is described as follows. The level shifting circuit with dynamic control can further include a bias generator 130 to provide a bias voltage VB1 to the dynamic controller 120. The input signals of the dynamic controller 120 include bias voltage VB1, input signal DIN, the control signal VC1 for generating the dynamic voltage VB2, and the control signal VC2 for transforming the input signal DIN into data signals VIP and VIN, which are complementary or invert to each other.

The level shifter 110 controlled by the dynamic controller 120 includes an input signal receiver 112, an output signal generator 114, and a bias current controller 116, which are respectively formed from MOS field effect transistors. In the embodiment, the input signal receiver 112 is formed from a pair of NMOS field effect transistors 200 and 202. The output signal generator 114 is formed from a pair of PMOS field effect transistors 204 and 206. The bias current controller 116 is formed from a pair of PMOS field effect transistors 208 and 210.

In the following description, a field effect transistor is simply referred as a transistor. The transistor usually has a gate electrode, a source electrode, and a drain electrode. Since the source electrode and the drain electrode are defined by actual circuit connection and are interchangeable, the source electrode and the drain electrode are generally referred as the diffusion electrode without distinction of source electrode and drain electrode.

The circuit connection of the level shifter 110 is as follows. The input signal receiver 112 includes a first transistor 200 having a first gate electrode and a second transistor 202 having a second gate electrode. The first gate electrode and the second gate electrode are respectively receiving the output data signals VIP and VIN, which are outputted from the dynamic generator 120 and form as a pair of complementary output data signals VIP and VIN.

The output signal generator 114 includes a third transistor 204 having third gate electrode and a fourth transistor 206 having a fourth gate electrode and is connected with the input signal generator 112 in series to generate the level-shifted data voltage signal OUTN and OUTP according to the complementary output data signals VIP and VIN. The level-shifted data voltage signals OUTN and OUTP are also a pair of signals complementary to each other, in which the third gate electrode and the fourth electrode crossingly output the complementary output the voltage signals OUTN and OUTP.

The bias current controller 116 includes a fifth transistor 208 having a fifth gate electrode and a sixth transistor 210 having a sixth gate electrode, and is connected with the output signal generator 114 in series. The fifth gate electrode and the sixth gate electrode are controlled by the voltage states of the dynamic voltage VB2 to generate two conductive states corresponding to a first current output level or a second current output level.

The operation mechanism of the level shifter 110 is following. When the level-shifted data voltage signals OUTN and OUTP are at stable stage, the dynamic voltage VB2 is at a lower voltage level but VB2≠GND. Thus, the PMOS transistors 208 and 210 are closing to a fully-conducted state, which produce a larger output capability of current. When the data signal DIN changes, the dynamic voltage VB2 as a pulse is inputted, so as to generate the data signal VIP and VIN. At this moment, the level shifter 110 is gradually transforming the input data signals VIP and VIN to a higher voltage range of VDDH-GND. The data voltage signals OUTP and OUTN to be outputted are still at unstable stage and both the transistors 204 and 206 are simultaneously conducted. Thus, a conducting path exists between VDDH and GND, causing a short-circuit current. In order to reduce the short-circuit current when the data voltage signals OUTP and OUTN are at unstable stage, the control signal VC1 with a short pulse is inputted to change the voltage state of the dynamic voltage VB2 to a higher bias level but VB2≠VDDH. At this moment, the transistors 208 and 210 are then approaching to the OFF state, so that the output capability of current can be reduced. As a result, consumption of the short-circuit current when the data voltage signals OUTP and OUTN are at unstable stage can be reduced and then improve the using efficiency of current.

For the effect of the control signals VC1 and VC2, the generating timing for both pulses is not necessarily set in a strict consistence. The pulse for the signal VC1 can be generated earlier or later than the pulse for the signal VC2. However, the two pulses need an overlapping region, which occur within the period when the data voltage signals OUTP and OUTN are at unstable stage, and then can have the effect to reduce the current consumption. In this consideration, the signal VC1 and the signal VC2 can also be combined as a single control signal, and the signal VC1 and the signal VC2 can be internally generated by proper delaying or advancing.

Figure 3:
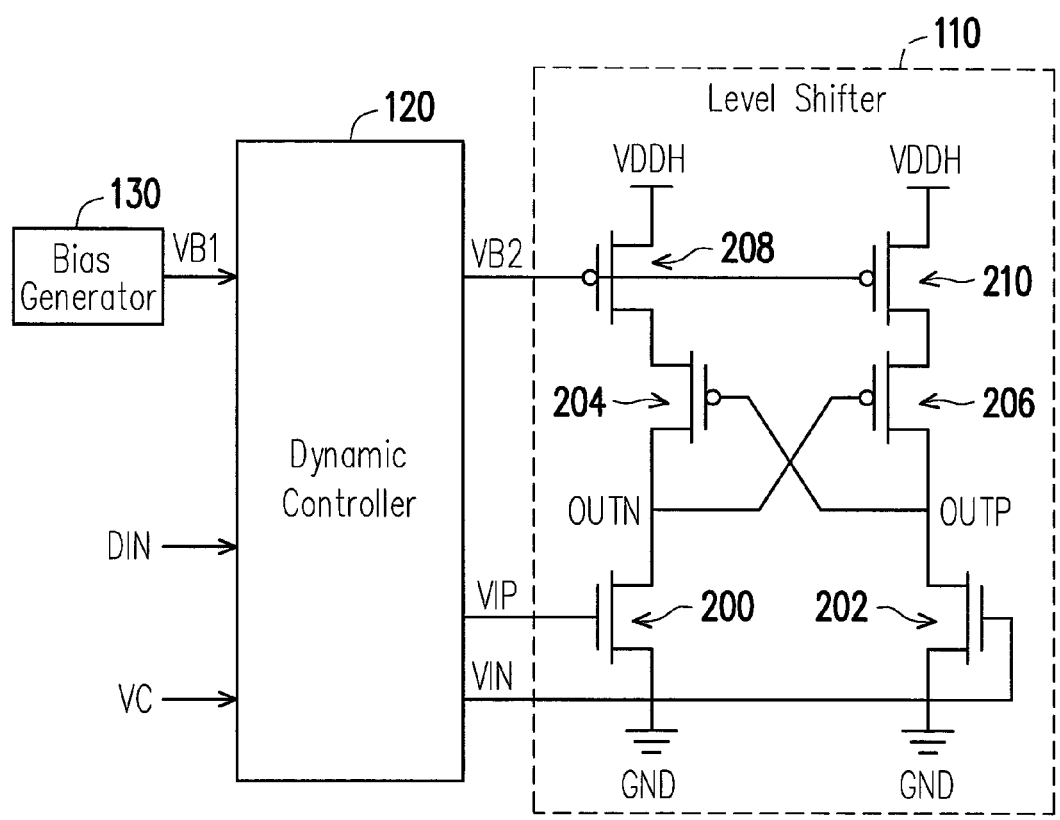
FIG. 3 is a circuit drawing, schematically illustrating a level shifting circuit with dynamic control according to an embodiment of the invention.

FIG. 3 is a circuit drawing, schematically illustrating a level shifting circuit with dynamic control according to an embodiment of the invention. In FIG. 3, also referring to the waveforms in time sequence for signals in FIG. 7 and FIG. 8, the two control signals VC1 and VC2 is combined as a single control signal VC. As also referring to FIG. 2, if the circuit is designed by setting the control signal VC 1 to be earlier than the control signal VC2, then it can be set as VC=VC1 in the example of FIG. 3 and the control signal VC2 is a delayed signal from the control signal VC by a delay circuit. Alternatively, if the control signal VC2 in FIG. 2 is designed to be earlier than the control signal VC1, then it can be set as VC=VC2 in the example of FIG. 3 and the control signal VC1 is a delayed signal from the control signal VC by a delay circuit. Even further, if the circuit in FIG. 2 is set in time as VC1=VC2, then the circuit in FIG. 3 in time can be set as VC=VC1=VC2.

As in the foregoing descriptions, the level shifting effect is to increase the voltage range to the positive direction. However under the same conception, it can be applied to transform the input signal DIN with the voltage range of VDD-GNDH into the output voltage signals OUTP and OUTN with the lower voltage range of VDD-GNDL.

Figure 4:
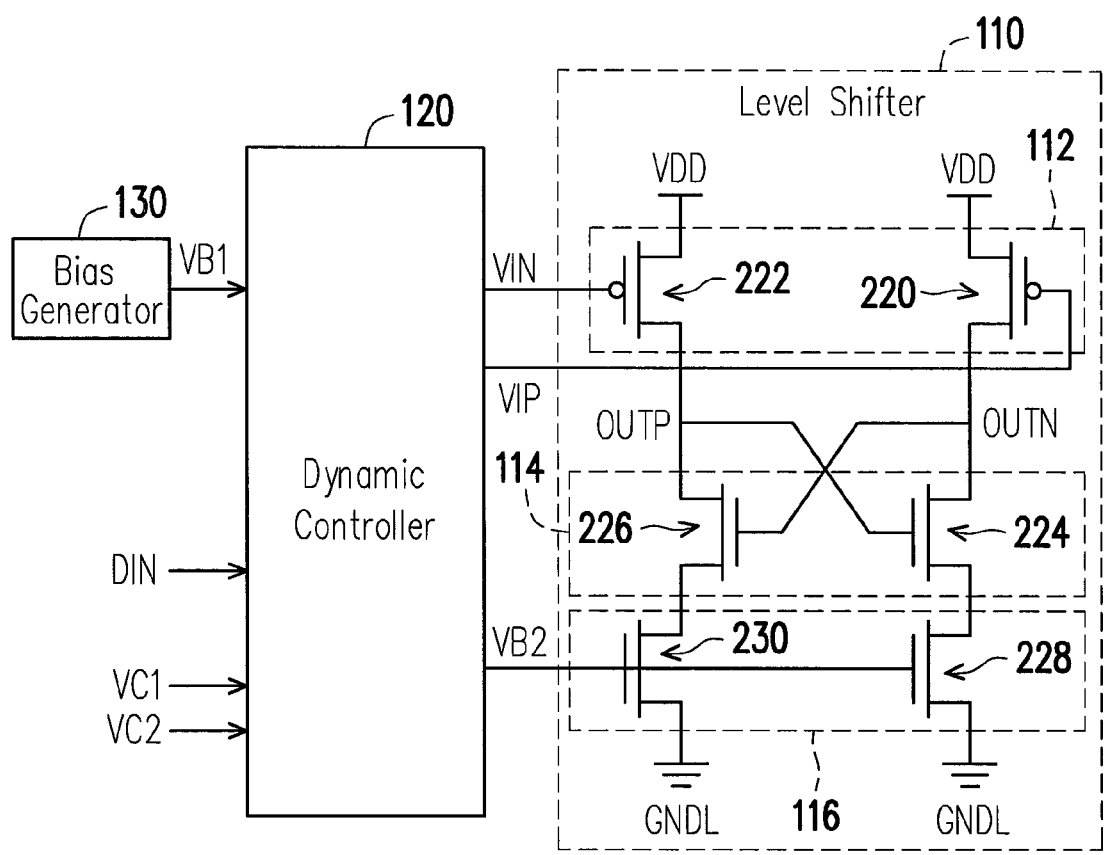
FIG. 4 is a circuit drawing, schematically illustrating a level shifting circuit with dynamic control, according to an embodiment of the invention.

FIG. 4 is a circuit drawing, schematically illustrating a level shifting circuit with dynamic control, according to an embodiment of the invention. In FIG. 4, for the level shifting circuit with dynamic control in the embodiment, it can also include a dynamic controller 120 and a level shifter 110. The dynamic controller 120 outputs a dynamic voltage VB2 and the output data signals VIP/VIN. The level shifter 110 controlled by the dynamic controller 120 includes an input signal receiver 112, an output signal generator 114, and a bias current controller 116, which are coupled in series between a ground voltage GNDL and a system voltage VDD.

Like the mechanism on FIG. 2, the input signal receiver 112 receives the output data signals VIP/VIN from the dynamic controller 120. The output signal generator 114 generates level-shifted data voltage signals OUTP and OUTN according to the output data signals VIP/VIN. The bias current controller 116 is controlled by the dynamic voltage VB2. When the level-shifted data voltage signals OUTP and OUTN are at the stable stage, they have a first current output level. When the level-shifted data voltage signals OUTP and OUTN are at the unstable stage, they have a second current output level. The first current output level is greater than the second current output level.

In the embodiment, the level shifter 110 controlled by the dynamic controller 120 includes an input signal receiver 112, an output signal generator 114, and a bias current controller 116, which are respectively formed from MOS field effect transistors.

In the embodiment, the input signal receiver 112 is formed from a pair of PMOS field effect transistors 220 and 222. The output signal generator 114 is formed from a pair of NMOS field effect transistors 224 and 226. The bias current controller 116 is formed from a pair of NMOS field effect transistors 228 and 230.

The circuit connection of the level shifter 110 is as follows. The input signal receiver 112 includes a first transistor 220 having a first gate electrode and a second transistor 222 having a second gate electrode. The first gate electrode and the second gate electrode are respectively receiving the output data signals VIP and VIN, which are outputted from the dynamic generator 120 and form as a pair of complementary output data signals VIP and VIN.

The output signal generator 114 includes a third transistor 224 having third gate electrode and a fourth transistor 226 having a fourth gate electrode and is connected with the input signal generator 112 in series to generate the level-shifted data voltage signal OUTN and OUTP according to the complementary output data signals VIP and VIN. The level-shifted data voltage signals OUTN and OUTP are also a pair of signals complementary to each other, in which the third gate electrode and the fourth electrode crossingly output the complementary output the voltage signals OUTN and OUTP.

The bias current controller 116 includes a fifth transistor 228 having a fifth gate electrode and a sixth transistor 230 having a sixth gate electrode, and is connected with the output signal generator 114 in series. The fifth gate electrode and the sixth gate electrode are controlled by the voltage states of the dynamic voltage VB2 to generate two conductive states corresponding to a first current output level or a second current output level.

The operation mechanism in the embodiment is following. When the level-shifted data voltage signals OUTN and OUTP are at stable stage, the dynamic voltage VB2 is at a higher voltage level but VB2≠VDD. Thus, the transistors 228 and 230 have a larger output capability of current. When the data signal DIN changes, the dynamic voltage VB2 as a pulse is inputted, so as to generate the data signals VIP and VIN. At this moment, the level shifter 110 is gradually transforming the input data signals VIP and VIN to a lower voltage range of VDD-GNDL. The data voltage signals OUTP and OUTN to be outputted are still at unstable stage and both the transistors 224 and 226 are simultaneously conducted. Thus, a conducting path exists between VDD and GNDL, causing a short-circuit current. In order to reduce the short-circuit current when the data voltage signals OUTP and OUTN are at unstable stage, the control signal VC1 with a short pulse is inputted to change the voltage state of the dynamic voltage VB2 to a lower bias level but VB2≠VDDL. At this moment, the transistors 228 and 230 are then approaching to the OFF state, so that the output capability of current can be reduced. As a result, consumption of the short-circuit current when the data voltage signals OUTP and OUTN are at unstable stage can be reduced and then improve the using efficiency of current.

Figure 5:
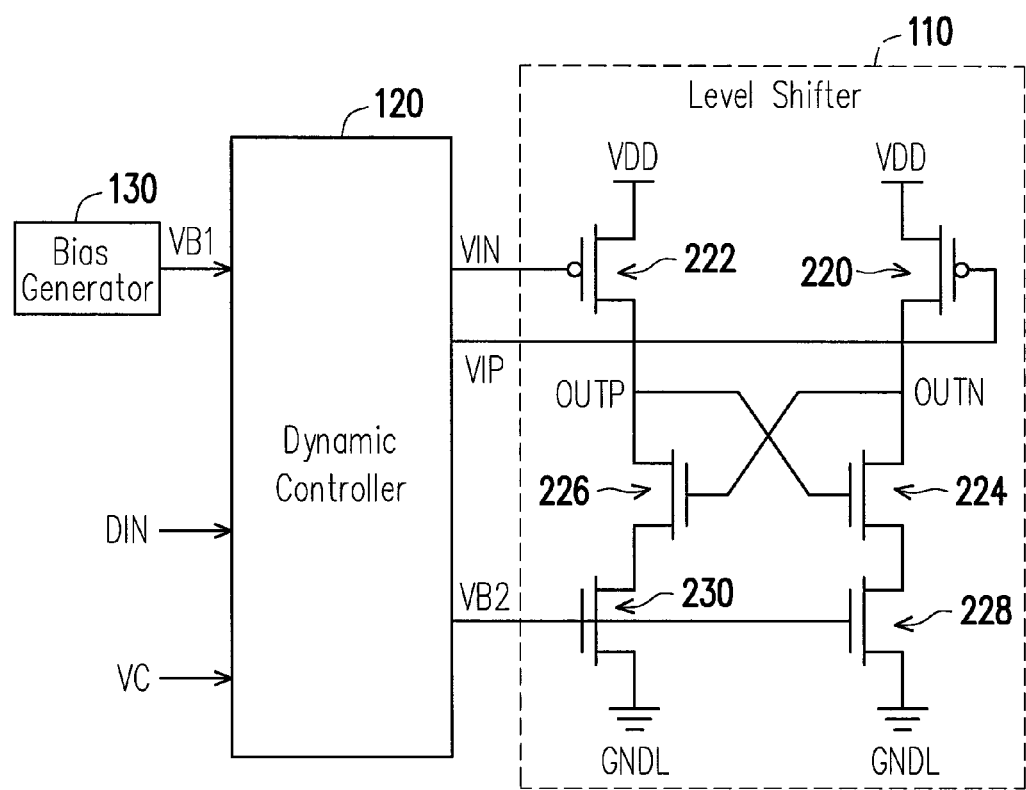
FIG. 5 is a circuit drawing, schematically illustrating a level shifting circuit with dynamic control, according to an embodiment of the invention.

To integrate the control signals VC1 and VC2, it can be dome=ne by taking the way shown in FIG. 3. FIG. 5 is a circuit drawing, schematically illustrating a level shifting circuit with dynamic control, according to an embodiment of the invention. In FIG. 5, also referring to the waveforms in time sequence for signals in FIG. 10 and FIG. 11, the two control signals VC1 and VC2 is combined as a single control signal VC. As also referring to FIG. 4, if the circuit is designed by setting the control signal VC1 to be earlier than the control signal VC2, then it can be set as VC=VC1 in the example of FIG. 5 and the control signal VC2 is a delayed signal from the control signal VC by a delay circuit. Alternatively, if the control signal VC2 in FIG. 4 is designed to be earlier than the control signal VC1, then it can be set as VC=VC2 in the example of FIG. 5 and the control signal VC 1 is a delayed signal from the control signal VC by a delay circuit. Even further, if the circuit in FIG. 4 is set in time as VC1=VC2, then the circuit in FIG. 3 in time can be set as VC=VC1=VC2.

Figure 6:
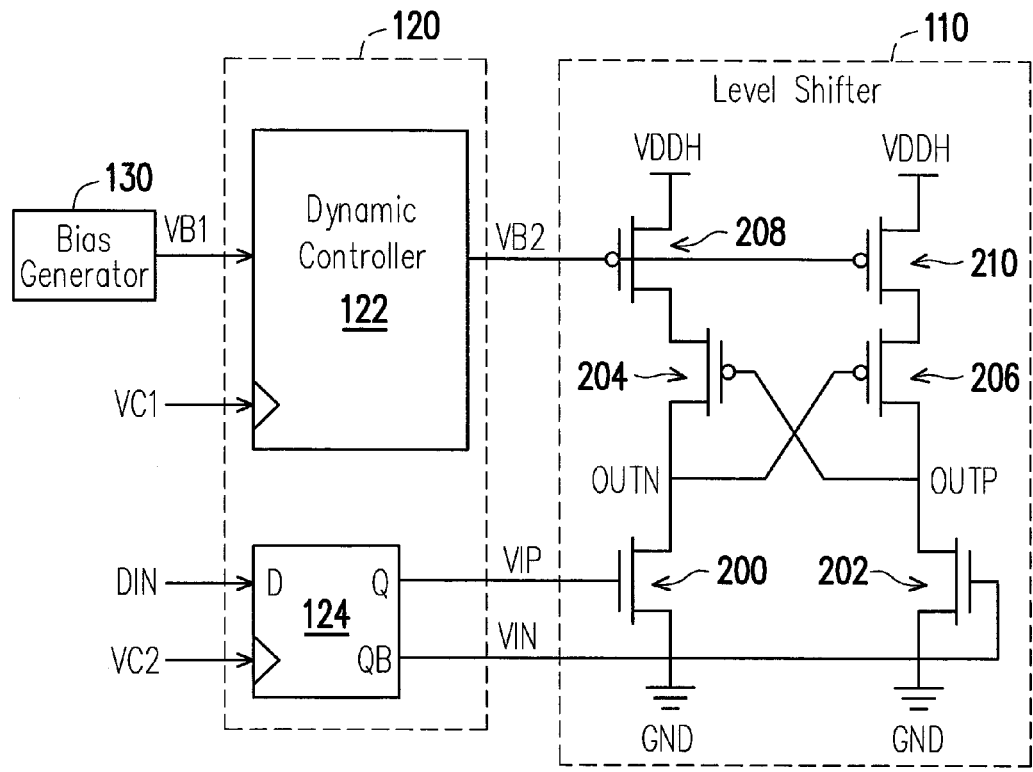
FIG. 6 is a circuit drawing, schematically illustrating a dynamic controller corresponding to the level shifting circuit with dynamic control in FIG. 2, according to an embodiment of the invention.

The circuit structure of the dynamic controller 120 is described in following. FIG. 6 is a circuit drawing, schematically illustrating a dynamic controller corresponding to the level shifting circuit with dynamic control in FIG. 2, according to an embodiment of the invention. In FIG. 6, the level shifting circuit with dynamic control in the embodiment is to transform the input data signal DIN with the voltage range of VDDL-GND into the data voltage signal OUTP and OUTN with a higher voltage range of VDDH-GND. The dynamic controller 120 in FIG. 6 is composed of a dynamic bias generator 122 and a trigger unit 124. The trigger unit 124 can be, for example, a D-type trigger unit. The dynamic bias generator 122 is used to generate a dynamic voltage VB2. The input signals of the dynamic bias generator 122 include a bias voltage VB1 and a control signal VC1. The trigger unit 124 is used to transform the input data signal DIN into the data signals VIP and VIN, which are complementary to each other. The dynamic voltage VB2 and the data signals VIP and VIN are used to control the level shifter 110. The operation mechanism of the level shifter 110 is as previously described.

The D-type trigger unit 124 receives the data signal DIN and the control signal VC2 to generate the data signals VIP and VIN. However, the data signals VIP and VIN cal also be generated by other manner, such as falling edge trigger unit, that is, the voltage of the data signal VIP and VIN are changed when the control voltage changes from the high voltage level to low voltage level. The data signal VIP and VIN are generated according to the data signal DIN. The data signal DIN is, for example, the inputted digital data of which the voltage levels for "0" or "1" are small. It needs the trigger unit 124 to produce the data voltage signals VIP and VIN, which are complementary to each other. So, the trigger unit 124 is not limited to the provided embodiments.

Figure 7:
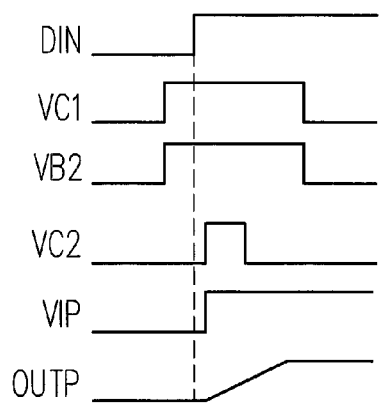
FIGS. 7-8 are drawings, schematically illustrating the time sequence of waveforms for the input signals and output signals of the level shifting circuit with dynamic control in FIG. 6, according to an embodiment of the invention.
Figure 8:
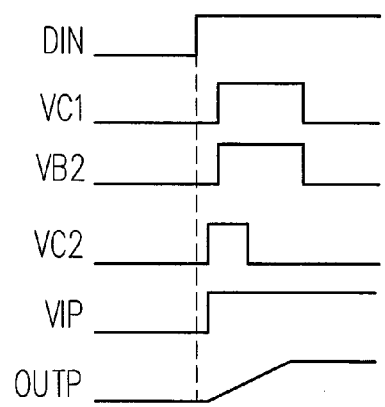

FIG. 7 is a drawing, schematically illustrating the time sequence of waveforms for the input signals and output signals of the level shifting circuit with dynamic control in FIG. 6, according to an embodiment of the invention, wherein the control signal VC1 is earlier than the control signal VC2. FIG. 8 is a drawing, schematically illustrating the time sequence of waveforms for the input signals and output signals of the level shifting circuit with dynamic control in FIG. 6, according to an embodiment of the invention, wherein the control signal VC1 is later than the control signal VC2.

In accordance with the circuit in FIG. 6, referring to the signal time sequence in FIG. 7 and FIG. 8, occurrence in time sequence for the two control signals VC1, VC2 is not necessary to be strictly set, in which the pulse for the control signal VC1 can be generated earlier or later than the pulse for the control signal VC2. It only needs an overlapping region, which is located within the period when data voltage signal OUTP and OUTN are at unstable stage and the effect to reduce the current consumption can be achieved. Further, to reduce the number of input signals, the control signal VC1 can be, for example, equal to the control signal VC2. The electric polarity of voltage, such positive voltage or negative voltage, for the control signals VC1 and VC2 is also not limited to the manner shown by the time sequence.

When the data signal DIN changes, the control signal VC2 cause the trigger unit 124 to generate the complementary data voltage signals VIP and VIN. At this moment, taking the data voltage signal OUTP as an example, it is at the unstable stage during the initial state before reaching to the predetermined voltage. The control signal VC1 would generate the dynamic voltage VB2 to control the bias current controller 116.

Figure 9:
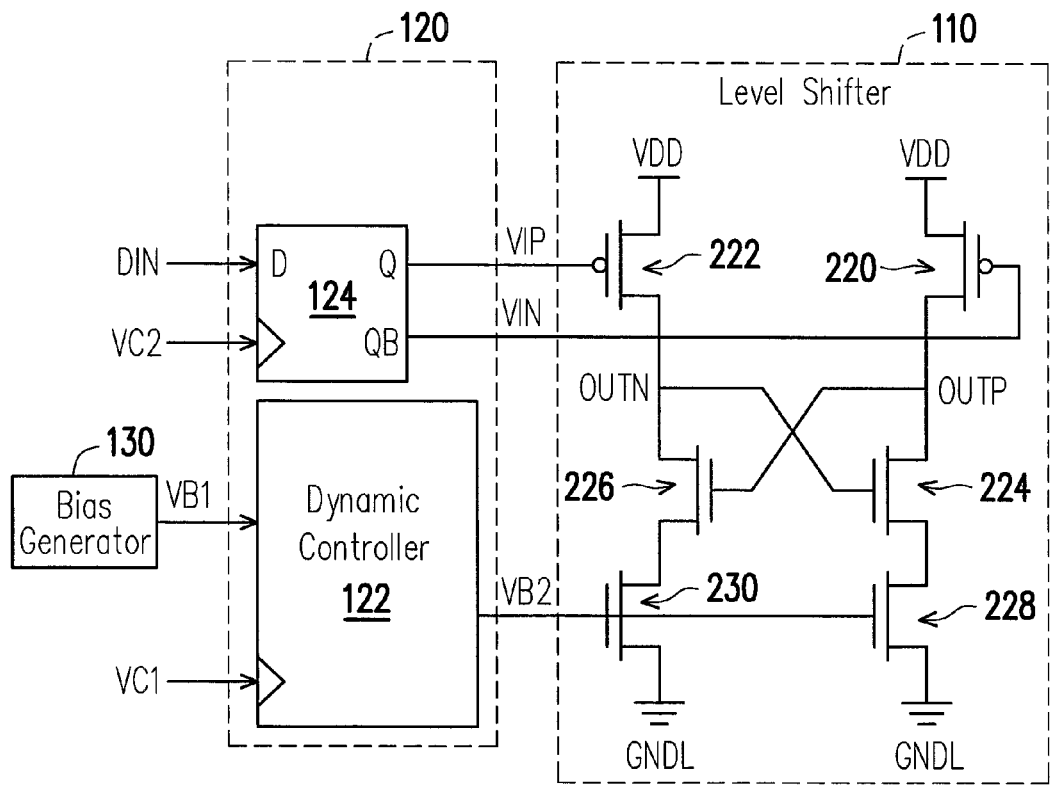
FIG. 9 is a circuit drawing, schematically illustrating a dynamic controller corresponding to the level shifting circuit with dynamic control in FIG. 2, according to an embodiment of the invention.

With respect to the level shifting circuit with dynamic control as shown in FIG. 4, the mechanism for the dynamic controller 120 to control the level shifter 110 still remains the same. FIG. 9 is a circuit drawing, schematically illustrating a dynamic controller corresponding to the level shifting circuit with dynamic control in FIG. 2, according to an embodiment of the invention. In FIG. 9, the dynamic voltage VB2 generated by the dynamic bias generator 122 of the dynamic controller 120 is connected to the NMOS transistors 228, 230 to control the different output capabilities of current. Since the control voltages for the NMOS transistor 228 and 230 are opposite to the control voltages for the PMOS transistors 208 and 210 in FIG. 6, the dynamic voltage VB2 needs to be invert in phase.

Figures 10, 11:
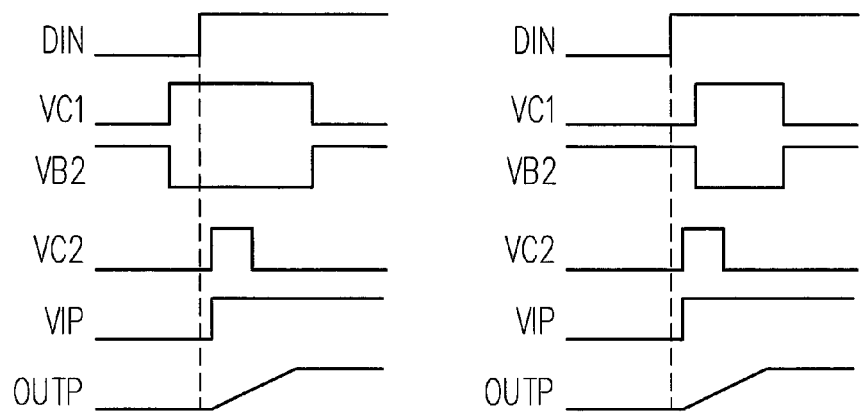
FIGS. 10-11 are drawings, schematically illustrating the time sequence of waveforms for the input signals and output signals of the level shifting circuit with dynamic control in FIG. 9, according to an embodiment of the invention.

FIG. 10 is a drawing, schematically illustrating the time sequence of waveforms for the input signals and output signals of the level shifting circuit with dynamic control in FIG. 9, according to an embodiment of the invention, wherein the control voltage VC1 is earlier than the control voltage VC2. FIG. 11 is a drawing, schematically illustrating the time sequence of waveforms for the input signals and output signals of the level shifting circuit with dynamic control in FIG. 9, according to an embodiment of the invention, wherein the control voltage VC1 is later than the control voltage VC2.

In FIG. 10 and FIG. 11, the dynamic voltage VB2 and the control signal VC1 are synchronous but opposite in electric polarity of voltage. In comparing with the waveforms in FIG. 7 and FIG. 8, the dynamic voltage VB2 is invert phase but the time sequence is than same.

Figure 12:
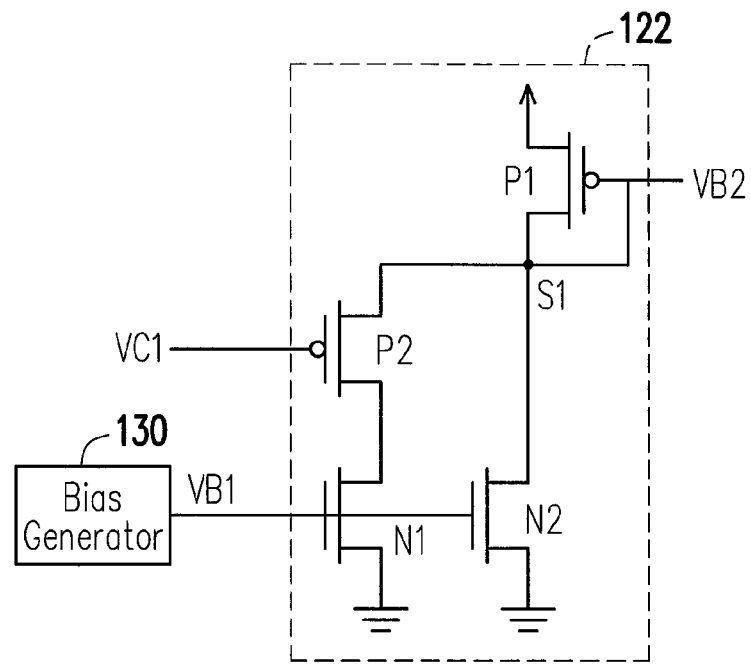
FIG. 12 is a circuit drawing, schematically illustrating the dynamic bias generator 122 of the dynamic controller 120 in FIG. 6, according to an embodiment of the invention.

The circuit structure of the dynamic bias generator 122 is further described in the following. FIG. 12 is a circuit drawing, schematically illustrating the dynamic bias generator 122 of the dynamic controller 120 in FIG. 6, according to an embodiment of the invention. In FIG. 12, for the dynamic controller 120 in FIG. 6, the structure in detail can be, for example, formed by four transistors in an embodiment, such as two NMOS transistor N1 and N2 and two PMOS transistors P1 and P2. The first NMOS transistor N1 has a gate electrode and two diffusion electrodes, in which the first gate electrode receives the bias VB1 output from the bias generator 130. One of the two diffusion electrodes is connected to the ground voltage. The second NMOS transistor N2 has a second gate electrode and two diffusion electrodes, in which the second gate electrode receives the bias VB1 output from the bias generator 130. One of the two diffusion electrodes is connected to the ground voltage, and another one is connected to a node S1. The first PMOS transistor P1 has a third gate electrode and two diffusion electrodes. The third gate electrode is connected to the node S1 and also outputs the dynamic voltage VB2. One of the two diffusion electrodes connected to the node S1 and another one is connected to the voltage power source. The second PMOS transistor P2 has a fourth gate electrode and two diffusion electrodes. The fourth gate electrode is controlled by the voltage control signal VC1. One of the diffusion electrodes is connected to the node S1 and another one is connected to another of the two diffusion electrodes of the first transistor N1. When the data input signal is stable, the voltage control signal VC1 is at low level and the transistor P2 would be conducted. The current flowing through transistor P1 is a sum of the two currents IN1 and IN2, IN1+IN2. Thus, the dynamic voltage VB2 is rather lower. When the data input signal changes, the voltage control signal VC1 is at high voltage level and the transistor P2 is not conducted. The current flowing through the transistor P1 is IN2 and the dynamic voltage VB2 is at high voltage level. This, the dynamic voltage VB2 can cause the bias current controller 116 to have different output capabilities of current.

Figure 13:
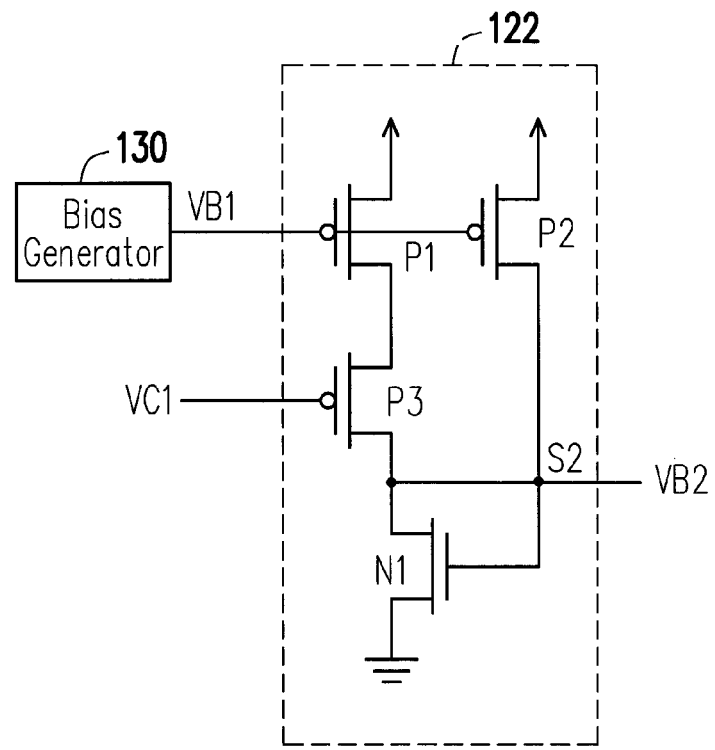
FIG. 13 is a circuit drawing, schematically illustrating the dynamic bias generator 122 of the dynamic controller 120 in FIG. 6, according to an embodiment of the invention.

FIG. 13 is a circuit drawing, schematically illustrating the dynamic bias generator 122 of the dynamic controller 120 in FIG. 6, according to an embodiment of the invention. In FIG. 13, for the dynamic bias generator 122 of the dynamic controller 120 in FIG. 9, the circuit can be in different design, accordingly. The dynamic bias generator 122 can also be formed by four transistors, for example.

The first NMOS transistor N1 has a first gate electrode and two diffusion electrodes, in which the first gate electrode connected to the node S2 to output the dynamic voltage S2. One of the two diffusion electrodes is connected to the ground voltage and another one is also connected to the node S2. The first PMOS transistor P1 has a second gate electrode and two diffusion electrodes, in which the second gate electrode receives the bias VB1 output from the bias generator 130. One of the two diffusion electrodes is receiving the power source. The second PMOS transistor P2 has a third gate electrode and two diffusion electrodes, in which the third gate electrode receives the bias VB1 output from the bias generator 130. One of the two diffusion electrodes receives the power source and another one is connected to the node S2. The third PMOS transistor P3 has a fourth gate electrode and two diffusion electrodes, in which the fourth gate electrode is controlled by the voltage control signal VC1. One of the two diffusion electrodes is connected to the node S2 and another one is connected to another one of the two diffusion electrodes of the transistor P1.

The dynamic voltage VB2 generated in the embodiment of FIG. 13 is invert in voltage phase to the dynamic voltage VB generated in FIG. 12 and therefore is used to control the NMOS transistors 228 and 230 of the bias current controller 16.

The circuits in FIG. 12 and FIG. 13 are not the only designs. It can have different circuit designs under the same function.

Figure 14:
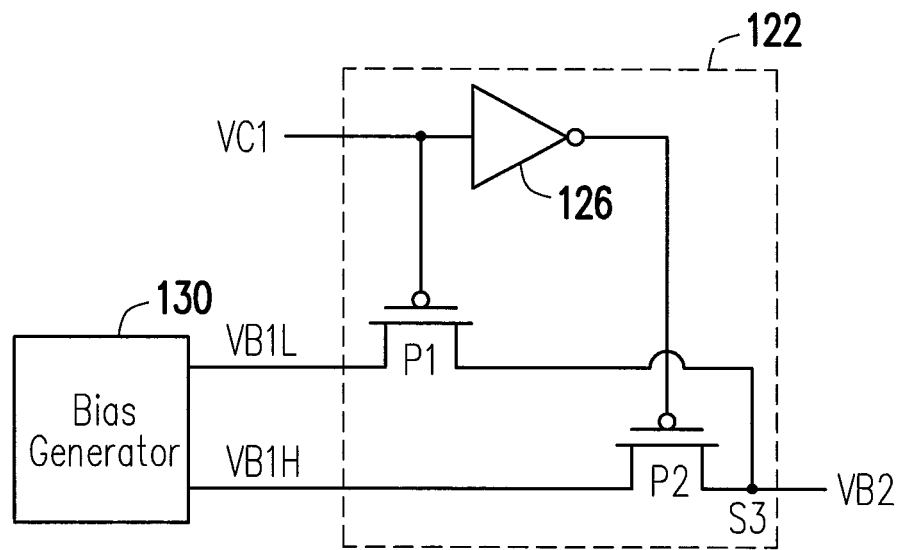
FIG. 14 is a circuit drawing, schematically illustrating the dynamic bias generator 122 of the dynamic controller 120 in FIG. 6, according to an embodiment of the invention.

FIG. 14 is a circuit drawing, schematically illustrating the dynamic bias generator 122 of the dynamic controller 120 in FIG. 6, according to an embodiment of the invention. In FIG. 14, the bias output from the bias generator 130 can include a first bias VB1L and a second bias VB1H. The first bias VB1L is lower than the second bias VB1H, in which VB1L≠GND, VB1H≠VDDH. The dynamic bias generator 122 in correspondence includes an inverter 126, a first PMOS transistor P1 and a second PMOS transistor P2. The inverter 126 has an input terminal an output terminal. The input terminal receives the voltage control signal VC1. The transistor P1 has a first gate electrode and two diffusion electrodes in which the first gate electrode is also connected to the input terminal of the inverter 126 to also receive the voltage control signal VC1. One of the two diffusion electrodes receives the first bias VB1L and another one is connected to the node S3 to output the dynamic voltage VB2. The transistor P2 has a second gate electrode and two diffusion electrodes in which the second gate electrode is also connected to the output terminal of the inverter 126. One of the two diffusion electrodes receives the second bias VB1H and another one is connected to the node S3 for common output the dynamic voltage VB2.

The operation mechanism is following. When the input signal is stable, the voltage control signal VC1 is at low voltage level, VB2=VB1L. The transistors 208 and 210 in FIG. 6 have larger output capability of current. When the input signal changes, the voltage control signal VC1 is at high voltage level, VB2-VB1H, reducing the output capability of current for the transistors 208 and 210.

For the dynamic bias generator 122 in FIG. 9, the NMOS transistors 228 and 230 are to be controlled different from the PMOS transistors 208 and 210 in FIG. 6. The electric polarity of the dynamic voltage VB2 needs to be changed. If the circuit in FIG. 14 is still taken, then the first bias VB1L and the second bias VB1H need to b exchanged. However, the circuit can also have other designs.

Figure 15:
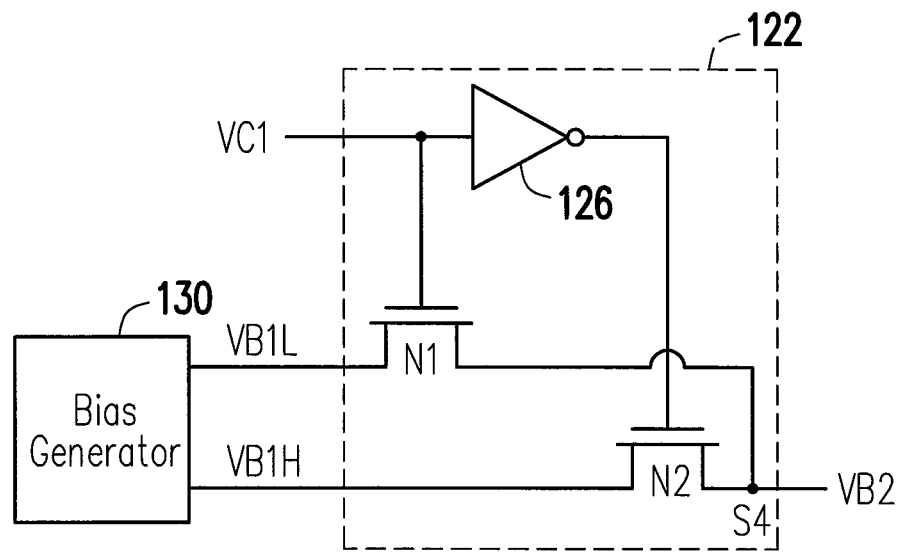
FIG. 15 is a circuit drawing, schematically illustrating the dynamic bias generator 122 of the dynamic controller 120 in FIG. 9, according to an embodiment of the invention.

FIG. 15 is a circuit drawing, schematically illustrating the dynamic bias generator 122 of the dynamic controller 120 in FIG. 9, according to an embodiment of the invention. In FIG. 15, the dynamic bias generator includes an inverter, a first NMOS transistor N1, a second NMOS transistor N2. The inverter 126 has an input terminal and an output terminal, the input terminal receives the voltage control signal; VC1. The transistor N1 has a first gate electrode and two diffusion electrodes, in which the first gate electrode is connected to the input terminal of the inverter 126 and also receives the voltage control signal VC1. One of the two diffusion electrodes receives the first bias VB1L, and another one is connected to the node S4 to output the dynamic voltage VB2. The transistor N2 has a second gate electrode and two diffusion electrodes. The second gate electrode is connected to the output terminal of the inverter 126, and one of the two diffusion electrodes receives the second bias VB1H, and another one is connected to the node S4 for commonly output the dynamic voltage VB2.

Further, if the circuit in FIG. 15 is taken to control the circuit in FIG. 6, it just needs to exchange the first bias VB1L and the second bias VB1H.

The provided embodiments can reduce the consumption from the short-circuit current by changing the voltage states of the dynamic voltage VB2 when the out voltage signals OUTN and OUTP are at stable stage or unstable stage, so as to control the different output capability of current. The power consumption due to the transient short circuit can be reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A level shifting circuit with dynamic control, comprising:
   a dynamic controller, outputting a dynamic voltage and an output data signal;
   a level shifter, controlled by the dynamic controller, comprising an input signal receiver, an output signal generator and a bias current controller, coupled in series between a ground voltage and a high level voltage,
   wherein the input signal receiver receives the output data signal from the dynamic controller, and the output signal generator generates a level-shifted data voltage signal,
   wherein the bias current controller is controlled by the dynamic voltage and is at a first current-output capability when the level-shifted data voltage signal is at a stable stage and is at second current-output capability when the level-shifted data voltage signal is at an unstable stage, wherein the level-shifted data voltage signal at the stable stage has a constant data voltage of the ground voltage or the high level voltage and the level-shifted data voltage signal at the unstable stage has a voltage level in changing but not reaching to the constant data voltage level yet, wherein the first current-output capability is greater than the second current-output capability but the second current-output capability is still in operation greater than zero capability.

2. The level shifting circuit with dynamic control as recited in claim 1, further comprising a bias generator to output a bias, wherein the dynamic controller comprises:
   a dynamic bias generator, receiving the bias and a first voltage control signal, and outputting the dynamic voltage, wherein the dynamic voltage outputs a voltage state according to the first voltage control signal to control the bias current controller of the level shifter; and a trigger unit, receiving an input data signal and a second voltage control signal, and outputting the output data signal corresponding to the input data signal, wherein the first voltage control signal and the second voltage control signal have an overlapping region when the level-shifted data voltage signal is at the unstable stage.

3. The level shifting circuit with dynamic control as recited in claim 2, wherein the first current-output capability has the voltage state at a first voltage level to cause the bias current controller to be closing to a conducted level, the second current-output capability has the voltage state at a second voltage level to cause the bias current controller to be approaching to an off level.

4. The level shifting circuit with dynamic control as recited in claim 2, wherein the first voltage control signal synchronizes with the dynamic voltage.

5. The level shifting circuit with dynamic control as recited in claim 2, wherein the first voltage control signal and the second voltage control signal are two signals externally inputted or internally generated according to an input signal.

6. The level shifting circuit with dynamic control as recited in claim 2, wherein the level shifter comprises:
the input signal receiver comprising a first transistor having a first gate electrode and a second transistor having a second gate electrode, the first gate electrode and the second gate electrode respectively receiving a pair of complementary data signals of the input data signal;
the output signal generator comprising a third transistor having a third gate electrode and a fourth transistor having a fourth gate electrode, coupled with the input signal receiver in series to generate the level-shifted data voltage signal according to the pair of complementary data signals, wherein the level-shifted data voltage signal is also a pair of complementary voltage signals, the third gate electrode and the fourth electrode are interlacing for outputting the pair of complementary voltage; and
the bias current controller comprising a fifth transistor having a fifth gate electrode and a sixth transistor having a sixth gate electrode, coupled with the output signal generator in series, wherein fifth gate electrode and the sixth gate electrode are controlled by the voltages state of the dynamic voltage to generate two conducting states for the first current-output capability or the second current-output capability.

7. The level shifting circuit with dynamic control as recited in claim 6, wherein the first transistor and the second transistor of the input signal receiver are NMOS transistors, the third transistor and the fourth transistor of the output signal generator are PMOS transistors, and the fifth transistor and the sixth transistor of the bias-current controller are PMOS transistors.

8. The level shifting circuit with dynamic control as recited in claim 7, wherein the first voltage control signal and the dynamic voltage are synchronizing and having a same voltage polarity.

9. The level shifting circuit with dynamic control as recited in claim 7, wherein the dynamic bias generator comprises:
a first NMOS transistor, having a first gate electrode and two first diffusion electrodes, wherein the first gate electrode receives the bias outputted from the bias generator and one of the two first diffusion electrodes is grounded;
a second NMOS transistor, having a second gate electrode and two second diffusion electrodes, wherein the second gate electrode receives the bias outputted from the bias generator and one of the two second diffusion electrodes is grounded and another one is connected to a node;
a first PMOS transistor, having a third gate electrode and two third diffusion electrodes, wherein the third gate electrode is connected to the node and also outputs the dynamic voltage, one of the two third diffusion electrodes is connected to the node and another one is connected to a power source; and
a second PMOS transistor, having a fourth gate electrode and two fourth diffusion electrodes, wherein the fourth gate electrode is controlled by the first voltage control signal, one of the two fourth diffusion electrodes is connected to the node and another one is connected to the another one of the two second diffusion electrodes.

10. The level shifting circuit with dynamic control as recited in claim 7, wherein the bias outputted from the bias generator includes a first bias and a second bias, the first bias is lower then the second bias, wherein the dynamic generator comprises:
an inverter, having an input terminal and output terminal, the input terminal receiving the first voltage control signal;
a first PMOS transistor, having a first gate electrode and two first diffusion electrodes, wherein the first gate electrode and the input terminal of the inverter are simultaneously receiving the first voltage control signal, one of the two first diffusion electrodes receives the first bias and another one is connected to a node to output the dynamic voltage; and
a second PMOS transistor, having a second gate electrode and two second diffusion electrodes, wherein the second gate electrode is connected to the output terminal of the inverter, one of the two second diffusion electrodes receives the second bias and another one is connected to the node to commonly output the dynamic voltage.

11. The level shifting circuit with dynamic control as recited in claim 6, wherein the first transistor and the second transistor of the input signal receiver are PMOS transistors, the third transistor and the fourth transistor of the output signal generator are NMOS transistors, and the fifth transistor and the sixth transistor of the bias-current controller are NMOS transistors.

12. The level shifting circuit with dynamic control as recited in claim 11, wherein the first voltage control signal and the dynamic voltage are synchronizing but having opposite voltage polarities.

13. The level shifting circuit with dynamic control as recited in claim 11, wherein the dynamic bias generator comprises:
a first NMOS transistor, having a first gate electrode and two first diffusion electrodes, wherein the first gate electrode is connected to a node to output the dynamic voltage, and one of the two first diffusion electrodes is grounded another one is also connected to the node;
a first PMOS transistor, having a second gate electrode and two second diffusion electrodes, wherein the second gate electrode receives the bias outputted from the bias generator, one of the two second diffusion electrodes receives a power source;
a second PMOS transistor, having a third gate electrode and two third diffusion electrodes, wherein the third gate electrode receives the bias outputted from the bias generator, one of the two third diffusion electrodes receives a power source and another one is connected to the node; and a third PMOS transistor, having a fourth gate electrode and two fourth diffusion electrodes, wherein the fourth gate electrode is controlled by the first voltage control signal, one of the two fourth diffusion electrodes is connected to the node and another one is connected to the another one of the two second diffusion electrodes of the first PMOS transistor.

14. The level shifting circuit with dynamic control as recited in claim 11, wherein the bias outputted from the bias generator includes a first bias and a second bias, the first bias is lower then the second bias, wherein the dynamic generator comprises:
  an inverter, having an input terminal and output terminal, the input terminal receiving the first voltage control signal;
  a first NMOS transistor, having a first gate electrode and two first diffusion electrodes, wherein the first gate electrode and the input terminal of the inverter are simultaneously receiving the first voltage control signal, one of the two first diffusion electrodes receives the first bias and another one is connected to a node to output the dynamic voltage; and
  a second NMOS transistor, having a second gate electrode and two second diffusion electrodes, wherein the second gate electrode is connected to the output terminal of the inverter, one of the two second diffusion electrodes receives the second bias and another one is connected to the node to commonly output the dynamic voltage.

* * * * *